United States Patent
Fister et al.

[11] Patent Number: 6,083,633
[45] Date of Patent: Jul. 4, 2000

[54] MULTI-LAYER DIFFUSION BARRIER FOR A TIN COATED ELECTRICAL CONNECTOR

[75] Inventors: Julius C. Fister, Hamden; Szuchain F. Chen, Orange; Christoper P. Laurello, Guilford; Arvind Parthasarathi, North Branford; Derek E. Tyler, Cheshire, all of Conn.

[73] Assignee: Olin Corporation, New Haven, Conn.

[21] Appl. No.: 08/877,020

[22] Filed: Jun. 16, 1997

[51] Int. Cl.⁷ ....................................................... B32B 15/01
[52] U.S. Cl. ............................ 428/615; 428/635; 428/644; 428/646; 428/647; 428/648; 428/655; 428/656; 428/668; 428/675; 428/676; 428/926; 428/929
[58] Field of Search ..................................... 428/647, 648, 428/929, 675, 676, 615, 616, 635, 644, 646, 655, 668, 671, 678, 681, 686, 926, 656; 205/182

[56] References Cited

U.S. PATENT DOCUMENTS

| | | |
|---|---|---|
| 1,750,092 | 3/1930 | Crawford et al. . |
| 3,247,082 | 4/1966 | Du Rose . |
| 3,635,702 | 1/1972 | Badia et al. . |
| 3,833,481 | 9/1974 | Olson et al. . |
| 3,892,637 | 7/1975 | Polti . |
| 3,954,420 | 5/1976 | Hyner et al. . |
| 4,131,517 | 12/1978 | Mitsuo et al. . |
| 4,167,459 | 9/1979 | Lee et al. . |
| 4,190,474 | 2/1980 | Berdan et al. . |
| 4,311,768 | 1/1982 | Berdan et al. . |
| 4,339,644 | 7/1982 | Aldinger et al. . |
| 4,374,311 | 2/1983 | Okahashi et al. . |
| 4,394,419 | 7/1983 | Konicek ................................. 428/416 |
| 4,411,961 | 10/1983 | Tremmel . |
| 4,441,118 | 4/1984 | Fister et al. . |
| 4,498,121 | 2/1985 | Breedis et al. . |
| 4,549,043 | 10/1985 | Kalubowila et al. . |
| 4,707,724 | 11/1987 | Suzuki et al. . |
| 4,736,236 | 4/1988 | Butt . |
| 4,880,461 | 11/1989 | Uchida ..................... 75/238 |
| 4,882,236 | 11/1989 | Smith et al. . |
| 5,001,546 | 3/1991 | Butt . |
| 5,019,222 | 5/1991 | Hino et al. . |
| 5,021,300 | 6/1991 | Stacey . |
| 5,028,492 | 7/1991 | Guenin . |
| 5,114,543 | 5/1992 | Kajiwara et al. . |
| 5,320,719 | 6/1994 | Lashmore et al. . |
| 5,384,204 | 1/1995 | Yumoto et al. . |
| 5,780,172 | 6/1996 | Fister et al. ............................. 428/647 |

FOREIGN PATENT DOCUMENTS 2-285091  11/1990  Japan .

OTHER PUBLICATIONS

P.J. Kay and C.A. Mackay "Barrier Layers Against Diffusion" Appearing in *Transactions of the Institute of Metal Finishing*, vol. 57 (1979) at pp. 169–174.

D.A. Stout and B.M. Lacey "The Characterization of Composite Copper, Nickel and Solder Coatings on Steel Wires by Scanning Auger Analysis" paper presented at the International Conference on Metallurgical Coatings and Process Technology, San Diego (Apr. 5–8, 1982) ©Elsevier Dequoia/The Netherlands.

(List continued on next page.)

*Primary Examiner*—Deborah Jones
*Assistant Examiner*—Robert R. Koehler
*Attorney, Agent, or Firm*—Gregory S. Rosenblatt; Wiggin & Dana

[57] ABSTRACT

An electrical conductor has a copper base substrate coated with a tin base coating layer. To inhibit the formation of a copper/tin intermetallic and the resultant depletion of the free, unreacted, tin utilized as an oxidation and corrosion barrier, a barrier is interposed between the substrate and the coating. In a first embodiment, the barrier is formed from multiple constituent layers, at least one of which is copper. The thickness ("y") of the copper layer is dependent on the anticipated service temperature and satisfies the equation $y=(-1.52+0.0871x+0.00859\ t)\pm 50\%$ where t=anticipated time at the service temperature, x=anticipated service temperature (Celsius), and y=the thickness of the copper layer in microinches. In a second embodiment, the barrier layer is formed from one or more constituent layers, at least one of which is iron or iron base.

23 Claims, 9 Drawing Sheets

OTHER PUBLICATIONS

D.R. Gabe "Whisker Growth on Tin Electrodeposits" *Trans.IMF* (1987).

E.K. Ohriner "Intermetallic Formation in Soldered Copper–Based Alloys at 150° to 250°C" appearing in *Welding Journal* (Jul. 1987).

D. Iacovangelo "New Autocatalyic Gold Bath and Diffusion Barrier Coatings" G.E. Corporate Research and Development, Schenectady, New York 12301.

Chwan–Ying Lee and Kwang–Lung Lin "Ni–Cu–P and Ni–Co–P as a Diffusion Barrier Between an Al pad and a Solder Bump" *Thin Solid Films* 239 (1994).

Marjorie K. McGaughey "Interdiffusion Between Tin Coatings and Copper–Nickel Alloy Substrates" *The Pennsylvania State University* (May 1993).

J.A. Abys, J.J. Maisano, I.V. Kadija, E.J. Kudrak and S. Nakahara "Annealing Behavior of Palladium–Nickel Alloy Electrodeposits" *Plating & Surface Finishing* (Aug. 1996).

J.K. Lim, J.S. Russo and E. Antonier "Electroplated Palladium Coating As a Nicket Migration (Thermal) Barrier" appearing in *Plating & Surface Finishing*, pp. 64–67, (Mar. 1996).

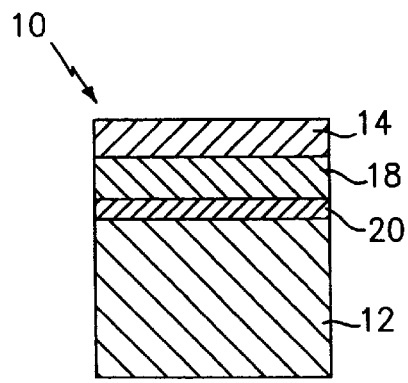
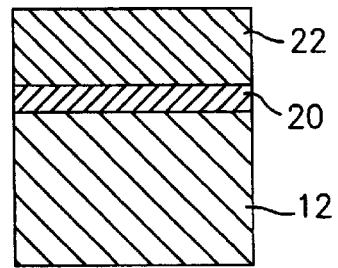
FIG. 7A    FIG. 7B
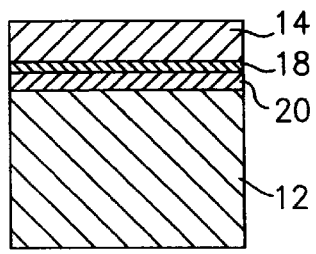
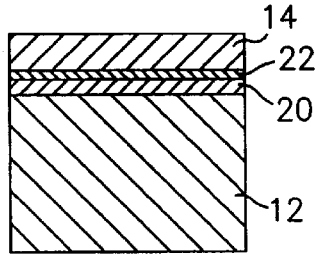
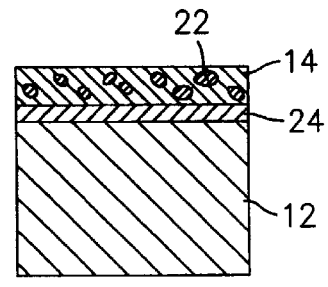
FIG. 8A    FIG. 8B    FIG. 8C
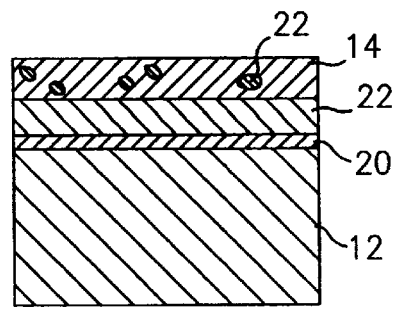
FIG. 9

75,000X 125,000X

MULTI-LAYER DIFFUSION BARRIER FOR A TIN COATED ELECTRICAL CONNECTOR

CROSS-REFERENCE TO RELATED APPLICATION

This patent application relates to U.S. Pat. No. 5,916,695 entitled "Tin Coated Electrical Connector" that was filed on Jul. 9, 1996 and is a continuation-in-part of U.S. Pat. No. 5,780,172 that was filed on Jun. 3, 1996 and in turn is a continuation-in-part of U.S. patent application Ser. No. 08/573,686 that was filed on Dec. 18, 1995 and is now abandoned. The present application incorporates by reference herein the disclosures contained within the three related patents and patent applications.

BACKGROUND OF THE INVENTION

1. Field of the Invention

This invention relates to tin coated copper based electrical conductors having a reduced rate of copper/tin intermetallic formation. More particularly, a diffusion barrier is disposed between a copper base substrate and a tin base coating. The diffusion barrier is a multi-layer structure with at least one of the constituent layers being copper base and having a thickness dependent on the thickness of the tin base coating.

2. Background of the Invention

Electrical conductors, including connectors such as sockets and plugs, leadframes and printed circuit boards are typically formed, at least in part, from a copper base alloy substrate that provides good electrical conductivity. Throughout this patent application, the word "base" is used in its common sense in the metallurgical arts, namely that the substrate is predominantly, or more than 50% by weight, copper. When exposure to elevated temperatures is anticipated in service, the electrical conductor substrate is typically formed from a copper base alloy having high strength and a resistance to stress relaxation.

Stress relaxation resistance is recorded as a percentage of the stress remaining after a sample of the copper base alloy is preloaded to a set percent of the yield strength, typically 80% in a cantilever mode per ASTM (American Society for Testing and Materials) specifications. The strip is then heated, typically to 125° C. for a specified number of hours, typically up to 3000 hours, and retested periodically. The higher the stress remaining at each retest, the better the utility of the specified composition for spring applications.

To reduce the elevated temperature oxidation, tarnish and corrosion of the copper base substrate, as well as to enhance solderability and to maintain electrical performance, a coating is frequently applied over the substrate. Typical coatings include nickel, palladium/nickel alloys, tin and tin base alloys. To minimize cost, tin is frequently used.

At elevated temperatures, the copper and the tin interdiffuse to form copper/tin intermetallic compounds. The formation of the intermetallic compounds reduces the amount of unreacted or free tin on the surface. The absence of a surface layer of free tin leads to an increase in electrical contact resistance and degrades the corrosion resistance, solderability and other performance characteristics of the electrical connector.

To reduce the rate of intermetallic formation and thereby reaction of the free tin, a barrier layer is interposed between the copper base substrate and the tin base coating layer. A publication by Kay et al. appearing in the *Transactions of the Institute of Metal Finishing*, Volume 59, 1979, at page 169, discloses that barrier layers such as nickel, cobalt and iron, as well as alloys such as tin/nickel, copper/tin and nickel/iron, are disposed between a copper base substrate and a tin coating to reduce the formation of intermetallic compounds.

Barriers formed from multiple layers of different metallic constituents are also known. For example, U.S. Pat. No. 5,384,204 by Yumoto et al. discloses a copper base tape automated bonding (TAB) tape that is coated with a tin or a tin/lead alloy film. A diffusion barrier is disposed between the substrate and the film. The barrier may be a single layer or multiple layers and is formed from materials that will not diffuse into an adjoining structure (i.e. into the substrate or into the coating).

In addition to electrical connectors exposed to high temperature during service life, such as automotive connectors, other applications that expose tin base coatings to high temperatures are the manufacture of printed circuit boards and the forming of leadframes for electronic packages.

The outer lead ends of copper base leadframes are typically coated with a solder, for joining the leadframe to the circuit traces of a printed circuit board (PCB). The leadframe may be exposed to a number of elevated temperature cycles (in excess of 175° C.) since different components may be joined to the PCB at different times and re-work may be required. Each elevated temperature cycle causes the growth of the copper/tin intermetallic at solder joints. To retain free solder, it is conventional to deposit a very thick solder layer (in excess of 400 microinches) on both the outer leads of the leadframe and on the circuit traces of the PCB.

There are problems associated with thick solder coatings, firstly an increase in cost. In addition, for the leadframe, the thick solder layer increases the leadframe thickness and causes problems with trimming and forming. For the PCB, the thick solder layer creates a planarity problem. These problems are becoming more pronounced with finer pitch packages and circuit traces where solder bridging is causing electrical short circuits.

While the prior art barriers are effective to reduce the rate of intermetallic formation, the reduction in rate is not sufficient for applications that require a minimum amount of free tin to remain after an extended thermal exposure such as 125° C. for 3000 hours. Accordingly, there remains a need for an enhanced barrier to be interposed between a copper base substrate and a tin base coating.

SUMMARY OF THE INVENTION

Accordingly, it is object of the invention to interpose a barrier between a copper base substrate and a tin base coating that reduces the rate of copper/tin intermetallic formation.

It is a feature of a first embodiment of the invention that the barrier is formed from multiple constituent layers with at least one of the constituent layers being copper. Another feature of the invention is that the critical thickness of the copper constituent layer is dependent on the service environment and that the critical thickness of the tin base coating layer is dependent on the thickness of the aforenoted copper constituent layer.

Among the advantages of the first embodiment are that the intermetallic growth rate at elevated temperatures, 120° C.–175° C., is reduced when compared to other barrier layers typically interposed between a copper base substrate and a tin base coating. Another advantage of this embodiment is that for a copper base connector utilized in an automotive application, the amount of free tin remaining after extended service life is increased, thereby increasing the oxidation, tarnish and corrosion resistance of the automotive connector while maintaining electrical performance.

A feature of a second embodiment of the invention is that the barrier layer is formed from iron or an iron base alloy. An advantage of this feature is that the barrier is capable of withstanding an aggressive deposition of the tin layer, such as experienced in hot air level tin (HALT) where a barrier layer coated copper strip is immersed in molten tin and on removal from the molten tin, the tin thickness is controlled by jets of hot air. Another feature of this embodiment of the invention is that when the iron thickness is between about 15 microinches and 150 microinches bend formability is substantially insensitive to the temper of the substrate. Similar performance advantages are noted in the process where, following removal from a molten tin bath the tin thickness is controlled by mechanical wiping.

In accordance with the invention, there is provided a composite material for use as an electrical conductor at an anticipated service temperature. The composite material has a copper base substrate and a tin base coating. Disposed between the substrate and the coating is a barrier layer. The barrier layer is formed from a plurality of constituent layers, a first one of which is copper and a second one of which is a transition metal. The thickness ("y") of the first constituent layer is the greater of 5 microinches and the value:

$$y=(-1.52+0.0871x+0.00859t)\pm 50\% \qquad (1)$$

where:
t=anticipated time at service temperature in hours
x=anticipated service temperature (Celsius)
y=first constituent layer thickness in microinches.

The above stated objects, features and advantages will become more apparent from the specification and drawings that follow.

IN THE DRAWINGS

Figure 3:
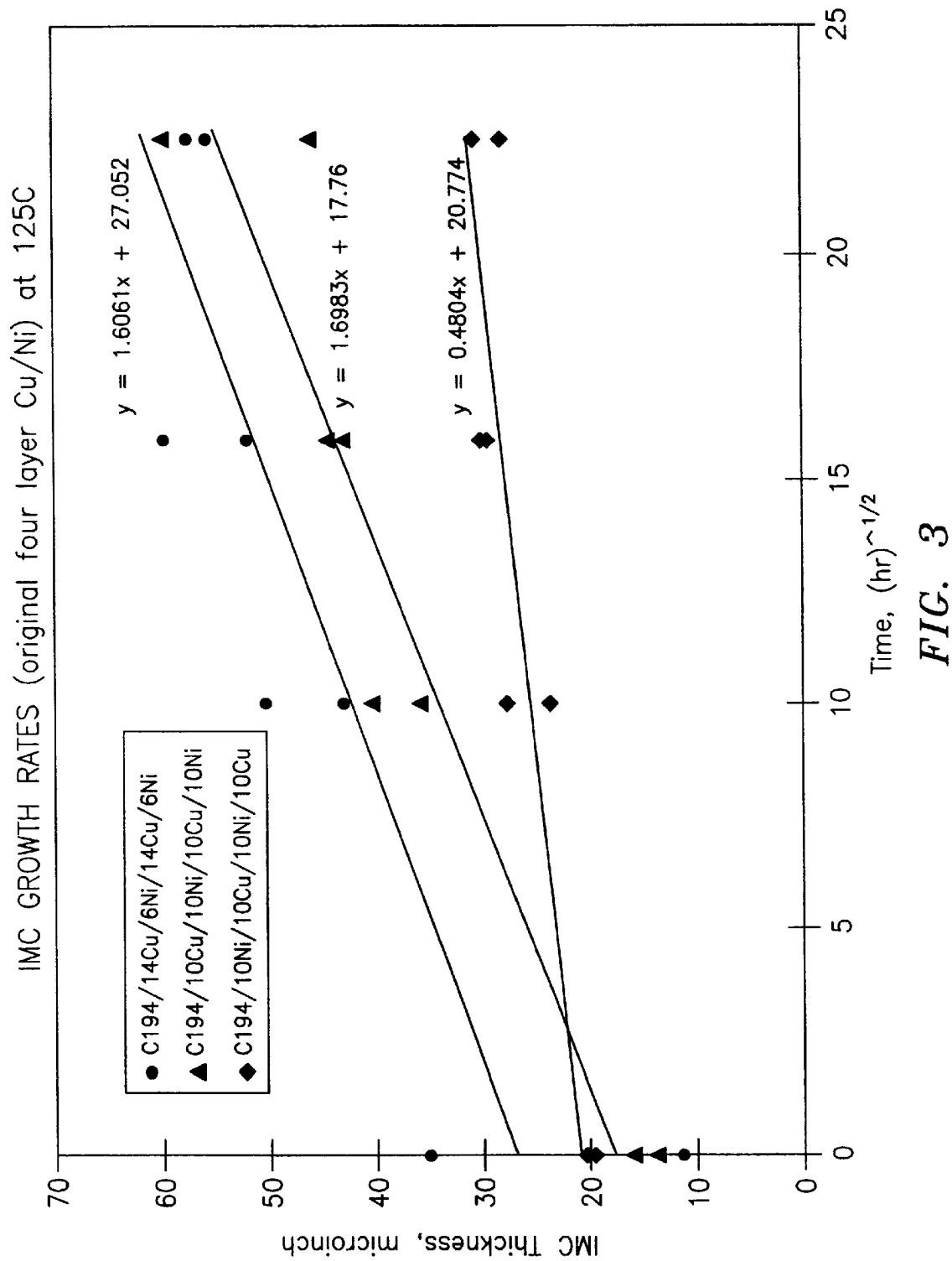

FIG. 3 graphically illustrates the intermetallic growth rate when the barrier layer contains two copper constituent layers and two nickel constituent layers.

Figure 4:
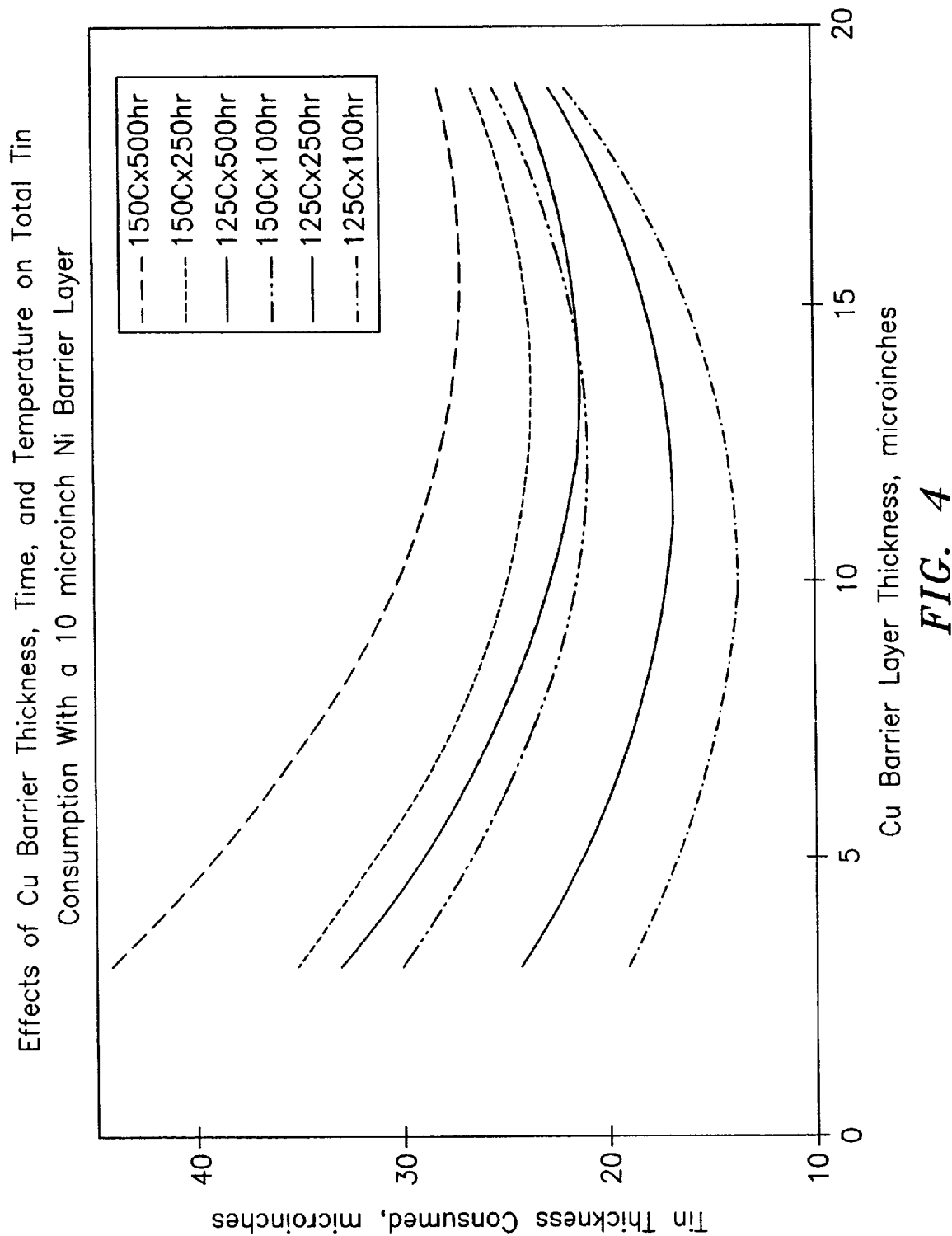

FIG. 4 graphically illustrates the effect of the thickness of an outermost copper constituent layer on the rate of total tin consumption.

Figure 5:
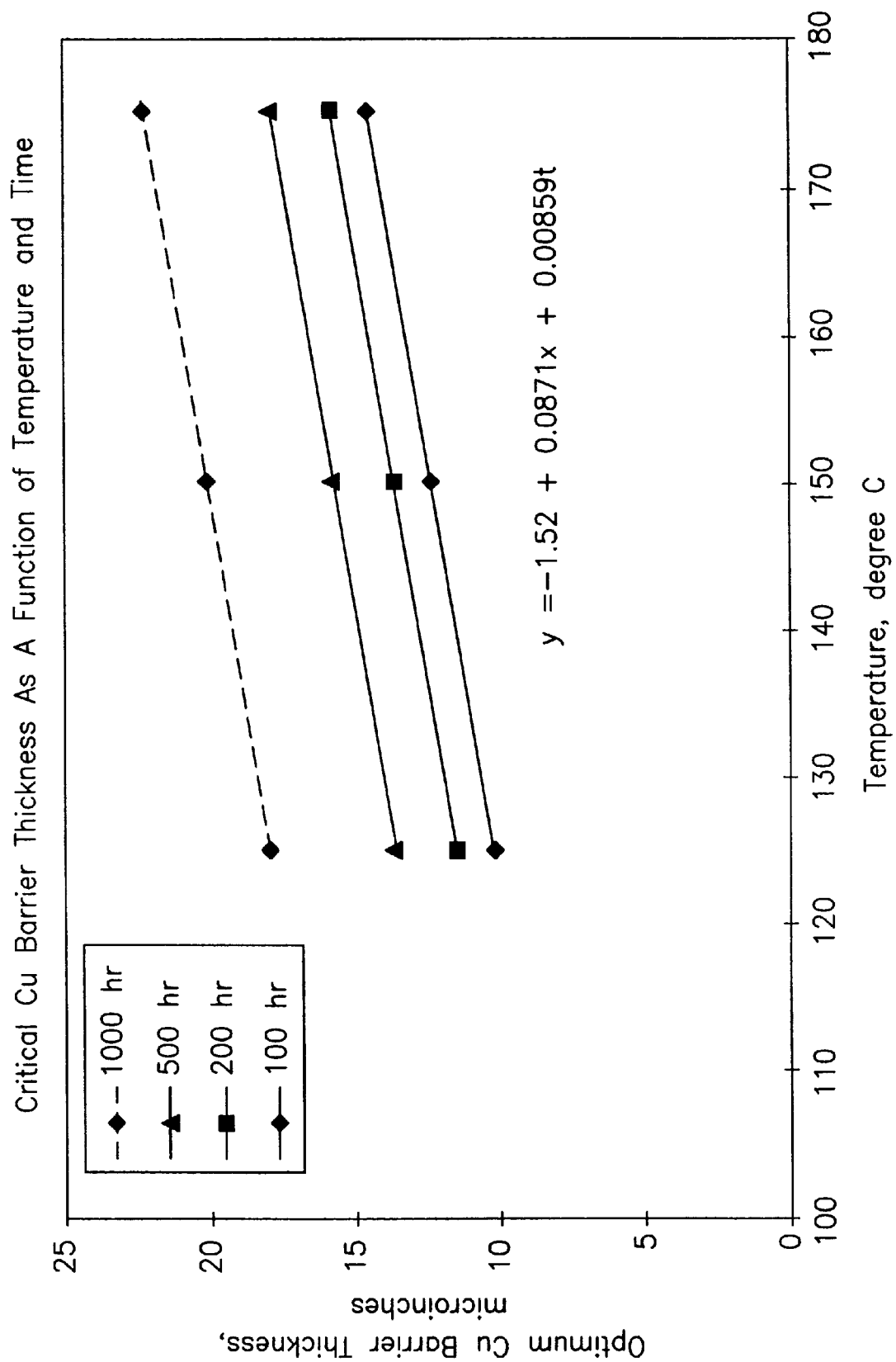

FIG. 5 graphically illustrates the relationship between the critical thickness of an outermost copper constituent layer and the service temperature.

Figure 6:
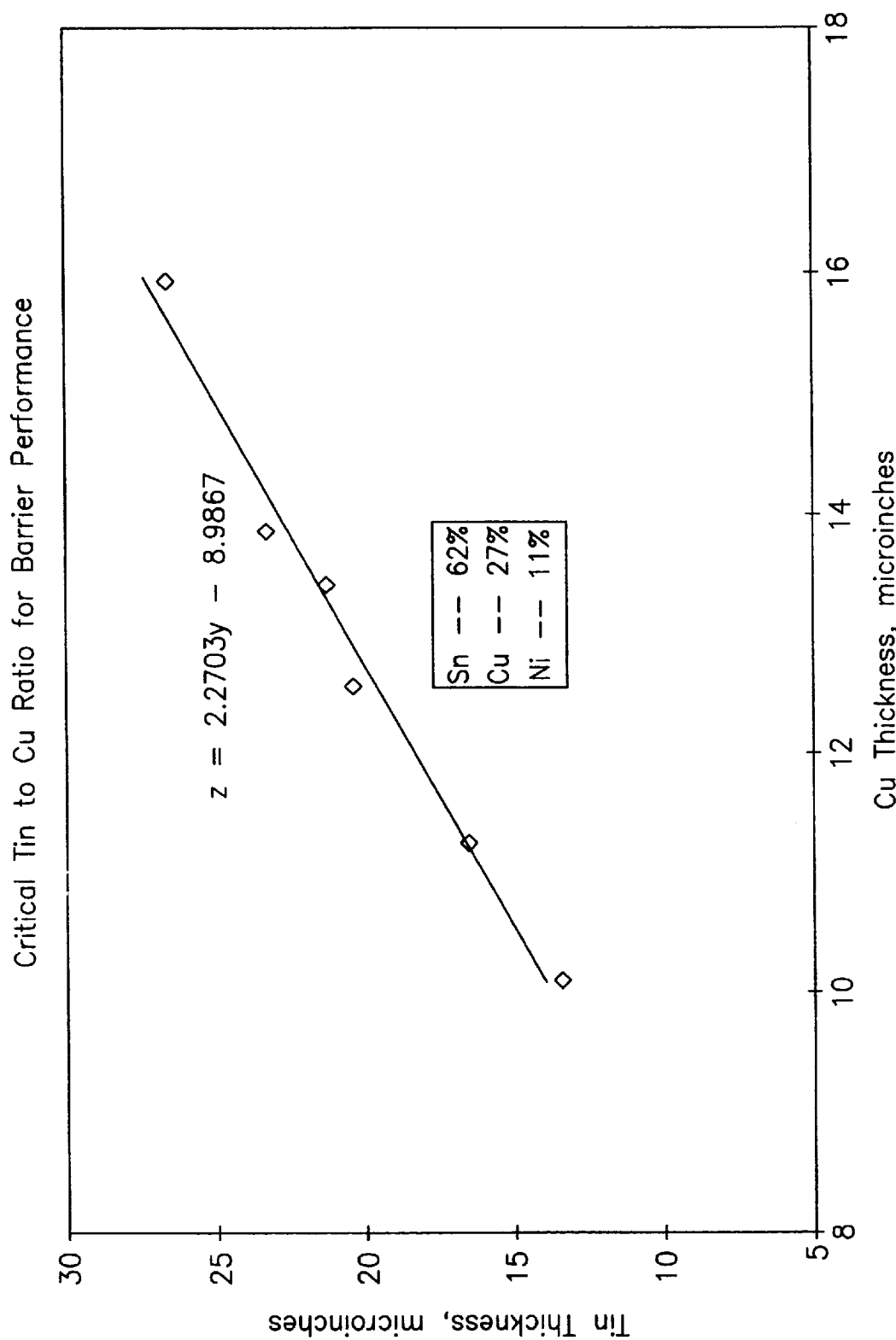

FIG. 6 graphically illustrates the relationship between the critical thickness of the tin coating layer and the thickness of the outermost copper constituent layer.

FIGS. 7–9 illustrate in cross-sectional representation the function of the barrier layer in maintaining a desired amount of free tin.

Figure 10:
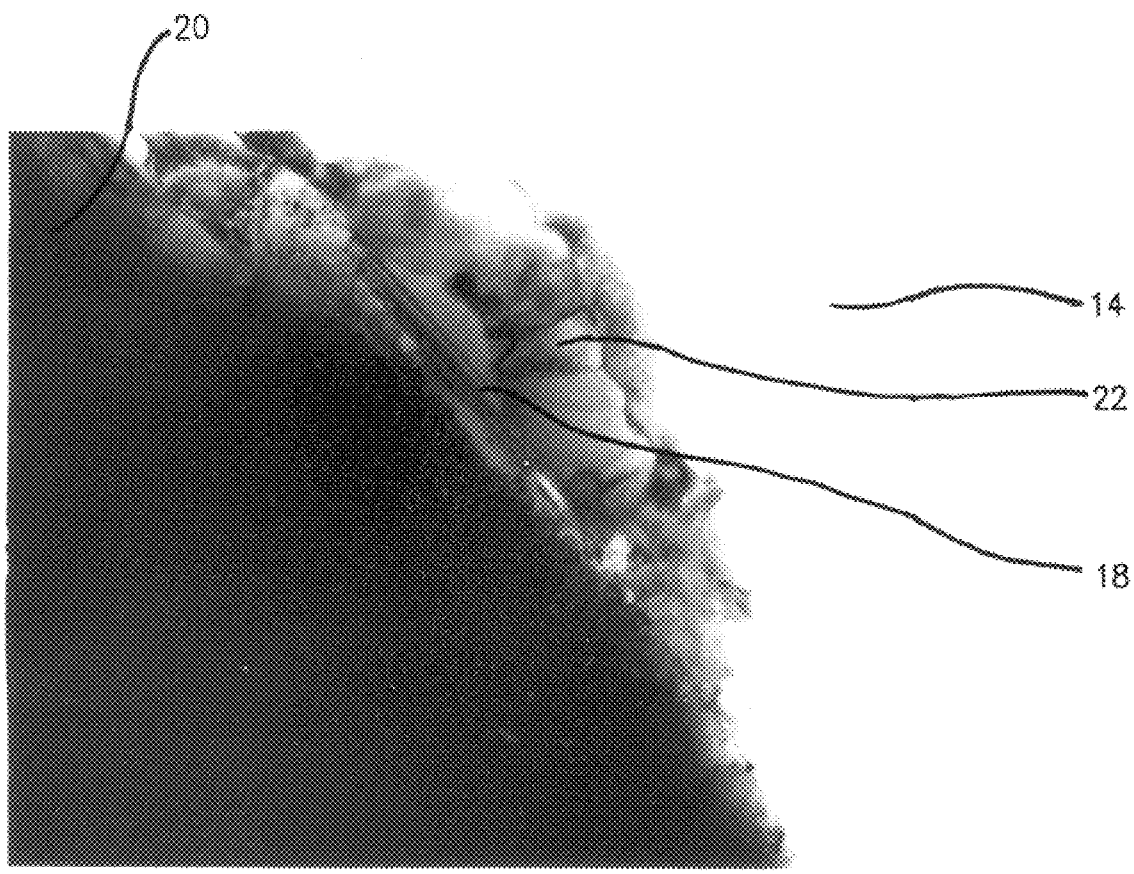
Figure 11:
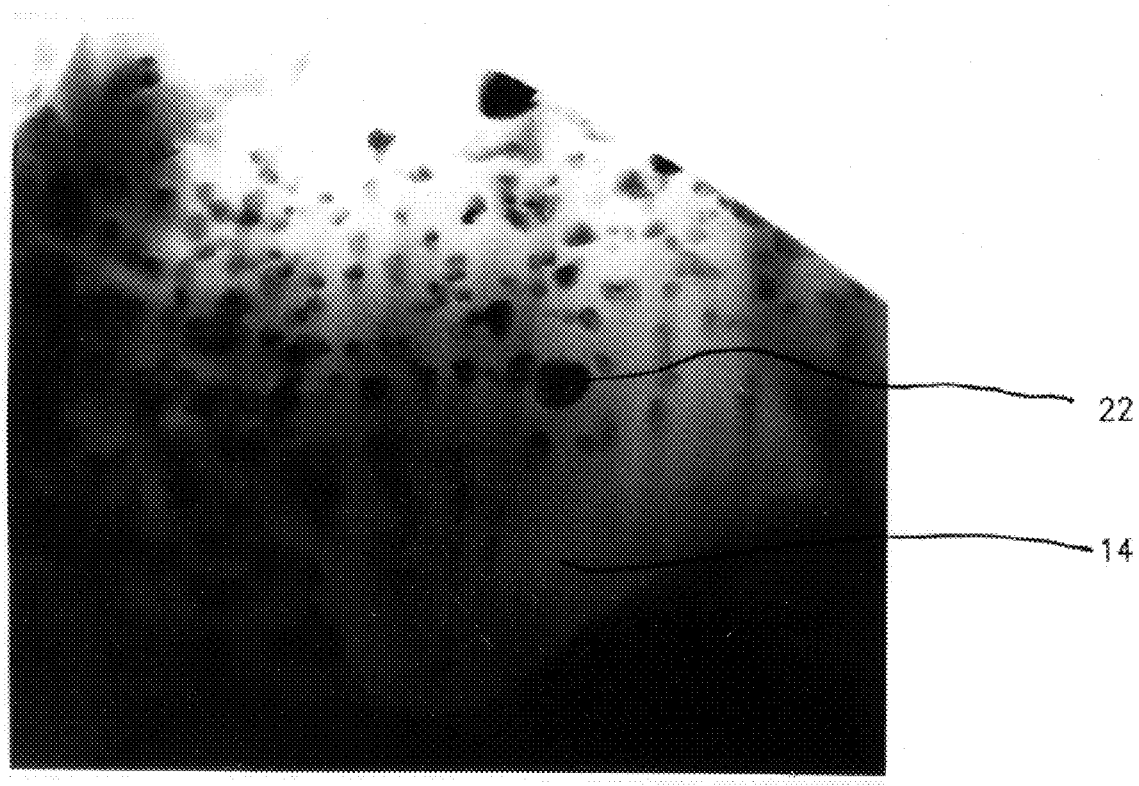

FIGS. 10 and 11 are photomicrographs illustrating the function of the barrier layer.

Figure 12:
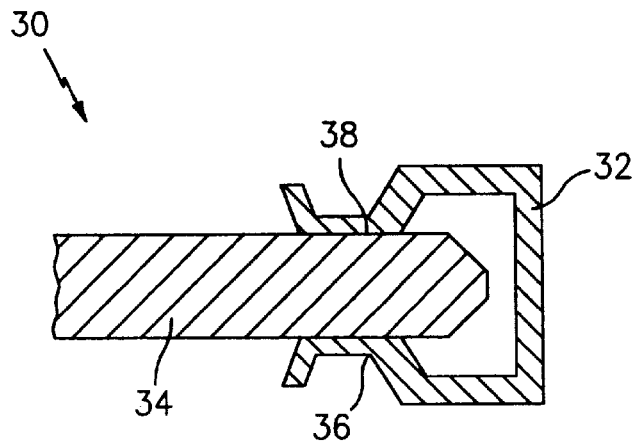

FIG. 12 illustrates in cross-sectional representation a socket and plug as electrical connectors in accordance with an embodiment of the invention.

Figure 13:
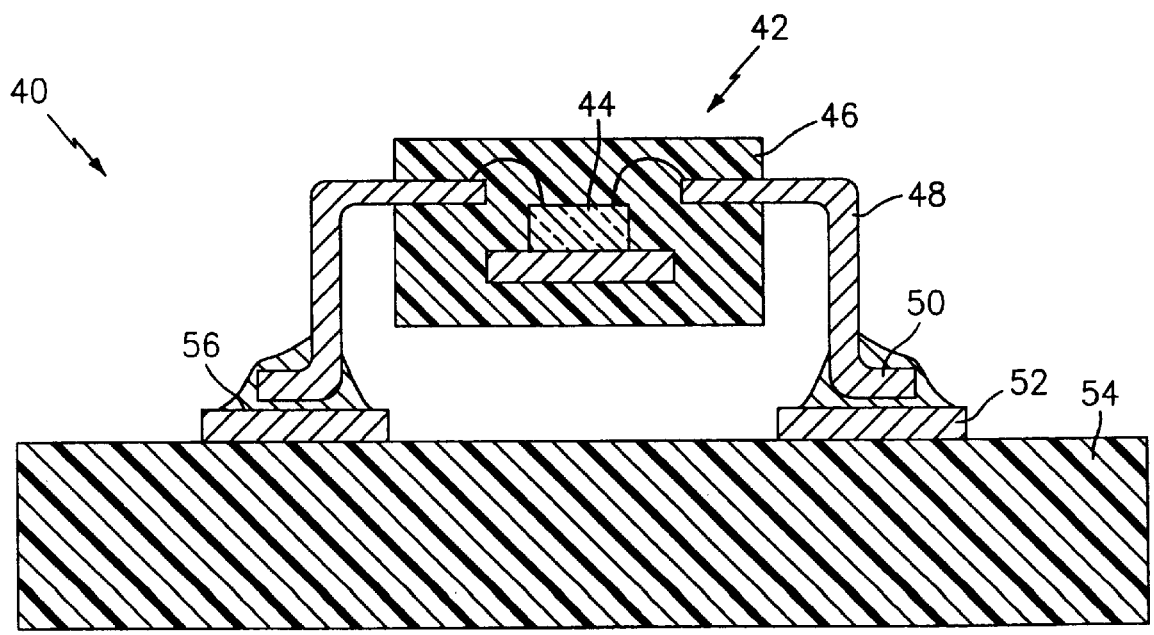

FIG. 13 illustrates in cross-sectional representation an electronic assembly having both a leadframe and conductive circuit traces on a PCB in accordance with an embodiment of the invention.

DETAILED DESCRIPTION

Figure 1:
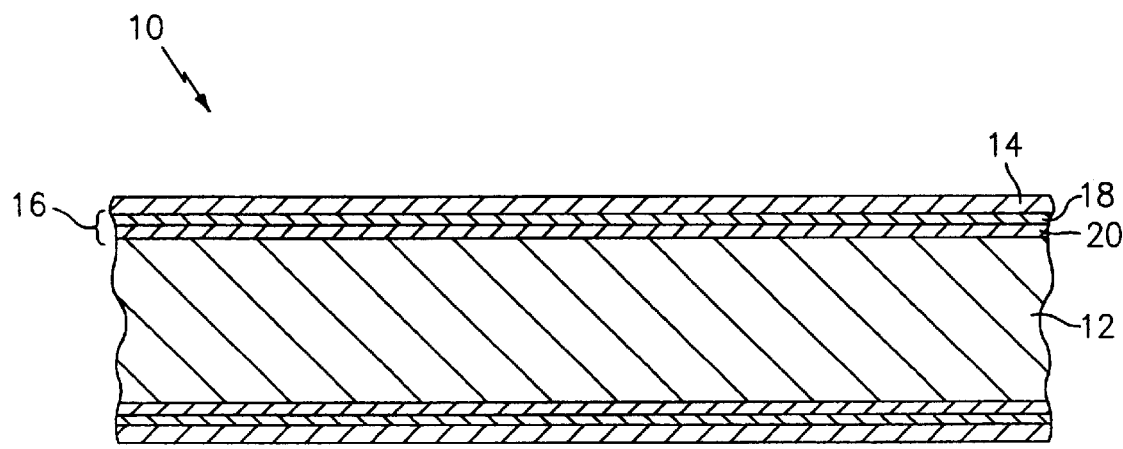
FIG. 1 shows in cross-sectional representation a metallic strip in accordance with an embodiment of the invention.

FIG. 1 illustrates in cross-sectional representation a first metallic strip 10 in accordance with an embodiment of the invention. The first metallic strip 10 has a substrate 12 that is formed from copper or a copper base alloy. The first metallic strip 10 is typically intended to be formed into an electrical conductor such as a connector or a leadframe. Forming typically involves mechanical processing such as stamping or bending. Accordingly, the substrate 12 is formed from a copper base alloy having relatively high electrical conductivity and good mechanical formability. Typically, the electrical conductivity is in excess of 10% IACS (International Annealed Copper Standard that rates "pure" copper as having an electrical conductivity of 100% IACS at 20° C.). Preferably, the electrical conductivity is in excess of 15% IACS. Most preferred is an electrical conductivity of in excess of 60% IACS.

Suitable copper base alloys for the substrate 12 include those designated by the Copper Development Association as, where throughout this patent application all compositions are given in weight percent unless otherwise indicated:

Copper alloy C194—2.1%–2.6% of iron, 0.05%–0.20% of zinc, 0.015%–0.15% of phosphorous and the balance copper and an electrical conductivity of between 40% IACS and 75% IACS dependent on processing);

Copper alloy C425—1.5%–3.0% of tin, 87%–90% of copper and the balance zinc with an electrical conductivity of 28% IACS; and Copper alloy C7025—2.2%–4.2% of nickel, 0.25%–1.2% of silicon, 0.05%–0.3% of magnesium and the balance copper with an electrical conductivity of 35%–40% IACS.

To achieve sufficient strength and retain good formability when the conductor is an electrical connector such as a socket or plug, the substrate 12 typically has a thickness of between 0.005 inch and 0.04 inch and, more preferably, the thickness is between 0.008 inch and 0.025 inch, and most preferably, on the order of 0.010 inch–0.020 inch.

When the conductor is a leadframe, a typical thickness is between 0.001 inch and 0.015 inch, with a preferred thickness being between 0.003 inch and 0.010 inch. When the conductor is a foil, such as used as circuit traces for a printed circuit board, the typical thickness is between 0.0001 inch and 0.006 inch, with a preferred thickness being between 0.0003 inch and 0.003 inch.

Copper and copper base alloys readily oxidize and are prone to corrosion. Accordingly, a coating 14 is deposited over the substrate 12. The coating 14 is tin or a tin base alloy and may be deposited by any suitable means. Typical commercial processes for depositing a tin base coating layer are electrolytic deposition, HALT, mechanical wipe and vapor deposition. The coating 14 may further include additional constituents to influence properties such as hardness and lubricity. Suitable additional constituents include silicon carbide, aluminum oxide, silica ($SiO_2$), carbon black, graphite, tungsten carbide, molybdenum disulfide and polytetrafluoroethylene ("TEFLON" a trademark of DuPont of Wilmington, Del.).

Copper and tin interdiffuse to form a copper/tin intermetallic compound. This intermetallic compound does not provide the oxidation and corrosion resistance of free, unreacted, tin and it is desirable to inhibit the formation of the intermetallic. The rate of intermetallic formation, and commensurately, the rate of depletion of free tin, is a temperature dependent phenomenon. The interdiffusion rate generally increases by about 100% for every 10° C. increase in exposure temperature.

In the absence of a diffusion barrier as provided by the present invention, to retain a minimum amount of free tin, the minimum thickness of the tin base coating layer, as deposited, is estimated to be:

100–120 microinches when the anticipated service life is 3000 hours at 125° C.; and 400–500 microinches when the anticipated service life is 3000 hours at 175° C.

A thick tin coating layer is expensive and increases the coefficient of friction and should be avoided. To retard the formation of the copper/tin intermetallic, and thereby enable the use of a thinner layer of the tin base coating for a given service condition, a barrier 16 is disposed between the substrate 12 and the coating 14. The barrier 16 contains a plurality of constituent layers 18, 20 formed from metals or metal alloys. A first constituent layer 18 is in direct contact with the coating 14, while a second constituent layer 20 is in direct contact with the first constituent layer 18. The second constituent layer 20 may be in direct contact with the substrate 12, or alternatively, in direct contact with an additional constituent layer.

At least one of the first or second constituent layers is copper or a copper base alloy. Preferably, the first constituent layer 18 is copper and the second constituent layer 20 is a transition metal such as nickel, iron, chromium, manganese or cobalt or an alloy having a transition metal base. Preferred transition metals are nickel and iron.

Figure 2:
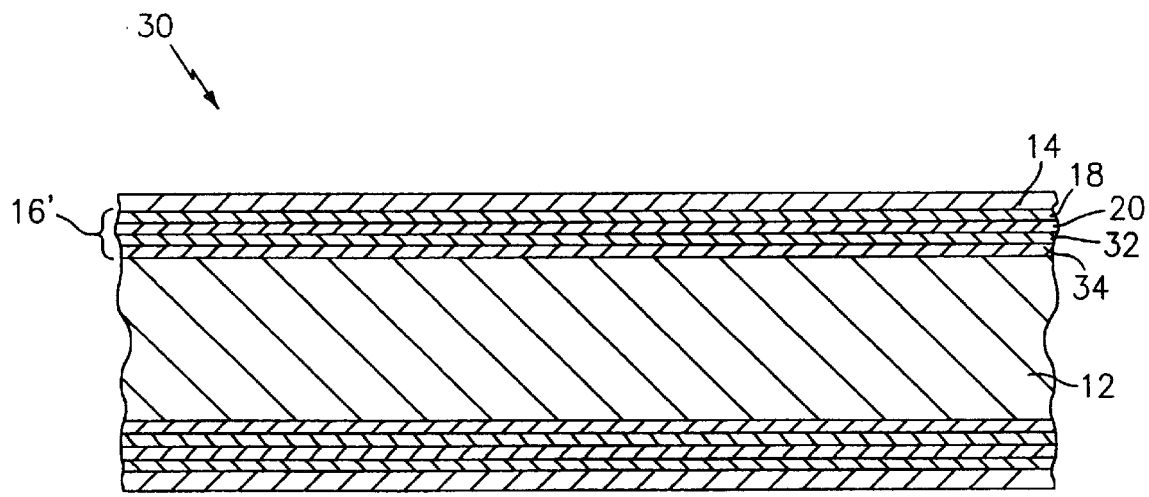
FIG. 2 shows in cross-sectional representation a second metallic strip in accordance with another embodiment of the invention.

FIG. 2 illustrates a second metallic strip 30 in accordance with a second embodiment of the invention. The second metallic strip 30 has a substrate 12 formed from copper or a copper base alloy. The substrate 12 is selected to have good electrical conductivity and good formability and may be any of the copper alloys suitable for the first embodiment as described above. A tin base coating 14 is disposed over the substrate 12 to provide oxidation resistance and tarnish resistance. A barrier 16' is formed from a plurality of constituent layers.

The first constituent layer 18 and second constituent layer 20 are as described above. One or more additional constituent layers are disposed between the substrate 12 and the second constituent layer 20. For example, a third constituent layer 32 may be formed from the same material as the first constituent layer 18 and a fourth constituent layer 34 may be formed from the same material as the second constituent layer 20. Alternatively, the one or more additional constituent layers may be other metals or metal alloys. Suitable as the additional constituent layers are tin, zinc, indium, tungsten, vanadium, manganese and alloys based on these metals.

The constituent layers may be deposited by any suitable process such as electroplating, electroless plating, plasma deposition, chemical vapor deposition or cladding. For accurate control of the constituent layer thicknesses, electroplating is preferred. Constituent layers formed from nickel may be deposited from an aqueous solution containing:

30–90 grams per liter of nickel as nickel sulfamate;

2–12 grams per liter of nickel as nickel chloride;

20–70 grams per liter of boric acid;

a pH between 2.5 and 5.0 and an electrolyte temperature of between 100° F. and 150° F. Typical plating parameters are 5–60 seconds at a current density of between 20 and 100 amps per square foot.

The substrate 12 is immersed in the electrolyte and is cathodically impressed with a desired voltage in accordance with conventional electroplating technique. The substrate is maintained in the electrolyte for a time to deposit a necessary thickness of nickel. For example, an immersion time of 20 seconds at a current density of 40 amps per square foot, will deposit a nickel thickness of 10 microinches.

A copper constituent layer may be electrolytically deposited from an aqueous electrolyte containing:

25–75 grams per liter of copper as copper sulphate;

50–120 grams per liter of sulfuric acid (2.7–6.7 vol. %);

and an electrolyte temperature of between 100° F. and 160° F. Typical plating parameters are 5–60 seconds at a current density of between 20 and 100 amps per square foot.

An immersion time of 18 seconds at a current density of 40 amps per square foot will deposit a 10 microinch copper layer.

While each constituent layer may be any effective metal or metal alloy, it is preferable that the first constituent layer, that constituent layer in direct contact with the coating 14 be copper or copper base. The reason for this is illustrated graphically in FIG. 3.

FIG. 3 illustrates the intermetallic growth rate for the metallic strip 30 of FIG. 2 having a barrier layer formed from four constituent layers, the first 18 and third 32 of which are copper and the second 20, and fourth 34 of which are nickel. As illustrated in FIG. 3, the intermetallic growth rate (the slope of the lines graphically illustrated in FIG. 3 and reproduced as Table 1 below) is about 3.5 times higher when the first and third constituent layers are nickel than when the first and third constituent layers are copper.

TABLE 1

| BARRIER LAYER<br>Thickness in microinches | INTERMETALLIC GROWTH<br>RATE (Slope)<br>Microinches/hour$^{0.5}$ |
| --- | --- |
| ● 14Cu/6Ni/14Cu/6Ni | 1.6061 |
| ▲ 10Cu/10Ni/10Cu/10Ni | 1.6983 |
| ◆ 10Ni/10Cu/10Ni/10Cu | 0.4804 |

FIG. 4 graphically illustrates the amount of tin consumed under the specified service conditions as a function of copper thickness. The curves were generated from a metallic strip of the configuration as illustrated in FIG. 1 having the copper base first constituent layer in direct contact with the tin coating and the second constituent layer, a 10 microinch nickel barrier layer, being in direct contact with both the substrate and the first constituent layer. The as-deposited thickness of the tin coating was between 35 and 55 microinches.

For each of the curves of FIG. 4, there is a critical copper thickness at which the tin reaction rate is minimized. If the nadir of each curve of FIG. 4 is graphically plotted, as illustrated in FIGS. 5 and 6, straight line relationships between the copper thickness and the service temperature and between the tin thickness and the copper thickness are achieved. Based on the empirical data set forth in FIGS. 5 and 6, the Applicants have determined that the critical copper thickness for the first constituent layer should be the larger of the minimum thickness necessary to eliminate pores through the deposit, typically about 5 microinches for a deposited layer and the value for "y" when:

$$y = (-1.52 + 0.0871x + 0.00859t) \pm 50\% \quad (2)$$

where:

t = anticipated time at service temperature x = anticipated service temperature (Celsius) and y = first constituent layer thickness in microinches.

More preferably:

$$y = (-1.52 + 0.0871x + 0.00859t) \pm 30\% \quad (3)$$

and most preferably:

$$y=(-1.52+0.0871x+0.00859t)\pm 15\%. \quad (4)$$

Once the critical copper thickness is determined, the critical thickness for the tin coating layer is determined. Based on FIG. 6:

$$z=(2.2703y-8.9867)\pm 50\% \quad (5)$$

where:
y=first constituent layer thickness in microinches and
z=tin thickness, as-deposited, in microinches.
More preferably:

$$z=(2.2703y-8.9867)\pm 30\% \quad (6)$$

and most preferably:

$$z=(2.2703y-8.9867)\pm 15\% \quad (7)$$

While the copper thickness is critical to control the rate of intermetallic formation, the significance of the nickel thickness is, surprisingly, believed to be minimal. There should be at least a minimum amount of nickel to ensure that there are no voids extending completely through the second constituent layer. A suitable minimum nickel thickness is about 2.5 microinches and generally, any thickness above about 5 microinches is sufficient for the nickel layer.

Applicants verified the relative insignificance of the nickel thickness by preparing a number of samples having either a copper alloy C425 or a copper alloy C7025 substrate and an electrolytically deposited tin coating layer. The barrier was as in FIG. 1 with the first constituent layer being copper and the second constituent layer being nickel. A variety of nickel and copper thicknesses were prepared and the intermetallic growth rate was measured at 125° C. and 150° C. at 100, 250 and 500 hours. A total of 164 data points were subjected to linear regression and a statistical significance value (P) assigned based on a least square method. The lower the P value, the more significant the variable is to the rate of intermetallic formation. In general, any P value less than 0.05 was considered significant.

TABLE 2

| VARIABLE | P VALUE |
| --- | --- |
| Ni | 0.812445 |
| Cu | 1.56E−05 |
| Cu$^2$ | 5.78E−11 |
| Temp. (C.) | 5.58E−16 |
| Time (hr) | 1.35E−10 |
| Cu × Temp. | 0.00196 |
| Cu × Time | 0.001012 |
| Ni × Temp. | 0.033691 |

Applicants believe that the function of the barrier layer is illustrated with reference to FIGS. 7–9. FIG. 7-A shows in cross-sectional representation a portion of a metallic strip 10 in accordance with the first embodiment of the invention prior to extensive exposure to elevated (125° C. or higher) temperature. The copper base substrate 12 is in direct contact with a second constituent layer 20 that is nickel. A first constituent layer 18 that is copper is in direct contact with both the second constituent layer 20 and a tin base coating layer 14.

When the thickness of the first constituent layer exceeds the critical maximum of:

$$y=(-1.52+0.0871x+0.00859t)\pm 50\% \quad (8)$$

interdiffusion as illustrated in FIG. 7-B occurs. All of the free tin reacts with the copper of the first constituent layer to form intermetallic layer 22. This intermetallic layer, $Cu_6Sn_5$, is characterized by poor resistance to oxidation and corrosion and also degrades the electrical performance of the electrical conductor, When the thickness of the first constituent layer is less than the critical minimum of:

$$y=(-1.52+0.0871x+0.00859t)-50\% \quad (9)$$

interdiffusion as illustrated in FIG. 8 occurs. FIG. 8-A is prior to elevated temperature exposure as described above. After exposure to elevated temperature for a portion of the service life, the $Cu_6Sn_5$ layer 22 is developed between the second constituent layer 20 and the unreacted, or free tin, 14. The intermetallic does not interdiffuse with a transition metal second constituent layer and consumption of the free tin would be expected to cease. However, tin consumption continues. As illustrated in FIG. 8-C, the intermetallic 22 diffuses into the free tin 14 such that free tin is at the interface 24 with the second constituent layer. Nickel alone is less effective as a barrier to prevent the diffusion between tin and copper and the free tin at the interface 24 diffuses into the effectively infinite amount of copper in the substrate 12.

Only when the thickness of the first constituent layer 18 satisfies the equation:

$$y=(-1.52+0.0871x+0.00859t)\pm 50\% \quad (9)$$

does the composite, as illustrated in FIG. 9, retain a maximum amount of free tin over the time specified in the equation which is the service life.

While the intermetallic has been specified as $Cu_6Sn_5$, after extended periods at elevated temperatures, some nickel from the second constituent layer may diffuse into the intermetallic. The intermetallic would then be of the form $(Cu_aNi_b)_6Sn_5$ where the relative amounts of copper and nickel will be dependent on the interdiffusion rate.

FIG. 10 is a scanning transmission electron microscope (STEM) image of the barrier layer following electrolytic deposition of 50 microinches of tin coating 14 and tin reflow. Tin reflow involves heating the composite material to a temperature of about 300° C. for from about 2 to about 5 seconds to melt the tin coating providing a shiny, metallic, finish. The barrier 14 was 5 microinches of nickel as the second constituent layer 20 and 15 microinches of copper as the first constituent layer 18. A well defined $Cu_6Sn_5$ intermetallic 22 is visible.

FIG. 11 is a STEM image at 125,000× of the barrier area after thermal aging of 1000 hours at 125° C. The copper/tin intermetallic 22 has diffused into the free tin 14 and is dispersed throughout. It would be expected that the free tin will readily diffuse through the second constituent layer and be lost into the copper base substrate.

While the above-noted barrier layer is particularly effective when the tin coating is deposited electrolytically or by other methods that do not subject the substrate to temperatures in excess of 200° C. for an appreciable period of time, the barriers become less effective when the tin coating is deposited by HALT or mechanical wipe. In the HALT process, the copper base substrate is immersed in molten tin. Tin has a melting temperature of 232° C. and immersion is typically at a temperature of between 250° C. and 310° C. At the relatively high temperature of immersion, barrier layers containing nickel and copper constituent layers are readily dissolved into the molten tin, destroying the utility of the barrier.

For HALT and mechanical wipe coating processes, an effective barrier layer is either a single layer or comprised of multiple constituent layers with at least one of the layers being iron. While iron barrier layers are known, for example as disclosed by Kay et al., iron base barriers have not achieved commercial success. This is believed due to the susceptibility of iron to corrosion and stresses in the iron deposit leading to cracking. Applicants have determined that if the thickness of any one iron layer is at least that amount effective to retain a substantially continuous barrier layer, following immersion, the iron base barrier is suitable for HALT and mechanical wipe applications.

A preferred iron thickness is between about 15 microinches and about 150 microinches, a more preferred iron thickness range is from about 15 to about 100 microinches and a most preferred iron thickness range is from about 15 microinches to about 50 microinches. Surprisingly, it has been found that within these thickness ranges, there is substantially no cracking of the iron deposit during bending notwithstanding the metallurgical temper of the substrate.

When the iron thickness is below the specified minimum, most of the iron dissolves into the molten tin during immersion and an insufficient amount remains to form an effective barrier. When the iron thickness exceeds this amount, the iron impacts both formability and electrical conductivity.

One particular application of electrical conductors in accordance with the invention is illustrated in FIG. 12. An electrical connector 30 includes a socket 32 and a plug 34. Both the socket 32 and the plug 34 are coated with a tin base coating. Good formability is required, notably to form the bends 36 in the socket 32. Further retention of free tin is required to maintain corrosion resistance and to maintain good electrical conductivity at the mating surface 38. Therefore, a barrier layer in accordance with the invention is disposed between the copper base substrate of the connector components 32, 34 and the tin base coating.

A second application is for the electronic assembly 40 illustrated in FIG. 13. An electronic package 42 encases a semiconductor device 44 in a polymeric molding resin 46. A copper base leadframe 48 electrically interconnects the semiconductor device 44 to external circuitry.

Outer lead ends 50 of the copper base leadframe 48 are bonded to copper base circuit traces 52 of a printed circuit board 54 by a solder 56. the solder 56 is tin containing and may be tin base. Therefore to retard the rate of formation of the copper/tin intermetallic, both the outer lead portion 50 of the leadframe 48 and the circuit traces 52 are coated with the barrier layers of the invention. For leadframes and circuit traces, the service temperature is commensurate with the reflow/rework temperature.

EXAMPLES

The advantages of the present invention will become more apparent from the Examples that follow. The Examples are exemplary and not intended to limit the scope of the invention.

Example 1

Assuming an anticipated service temperature of 150° C. and a time of 100 hours at the service temperature, a barrier layer in accordance with FIG. 1 would have a first constituent layer of copper having a thickness of:

$$y=(-1.52+0.0871x+0.00859t)\pm 50\% \quad (10)$$

$$y=(-1.52+0.0871(150)+0.00859(100))\pm 50\% \quad (11)$$

$$y=(-1.52+13.06+0.47)\pm 50\% \quad (12)$$

$$y=12\pm 50\% \quad (13)$$

The critical thickness of the copper layer would be between 6 and 18 microinches. If the thickness of a nickel second constituent layer was at least the minimum effective to avoid porosity, i.e. 5 microinches, then the critical thickness of the tin coating layer would be:

$$z=(2.2703y-8.9867)\pm 50\% \quad (14)$$

$$z=2.2703(12)-8.9867)\pm 50\% \quad (15)$$

$$z=27.2436-8.9867\pm 50\% \quad (16)$$

$$z=18\pm 50\% \quad (17)$$

The critical thickness of the tin coating is from 9 microinches to 27 microinches, considerably less than the in excess of 200 microinches of tin required when there is no barrier layer or the typical in excess of 100 microinches utilized with conventional (nickel or copper) barriers.

Example 2

An iron coating was deposited onto extra spring temper copper alloy C194 substrates (0.5 inch wide×0.010 inch thick) and ½ hard temper copper alloy C194 substrates (0.5 inch wide×0.015 inch thick). The coated substrates were bent about a radius of 2.4 t, where t is the thickness of the metallic strip. The bend was then examined at a magnification of 30× for cracking and recorded as Table 3. The absence of severe cracking is an indication of good formability.

The iron was deposited electrolytically from an aqueous electrolyte containing:

150–400 grams per liter of iron sulfate;

pH of between 1.5 and 3.5; and temperature of between 100° F. and 160° F.

Typical plating parameters were a time of between 5 and 60 seconds at a current density of between 20 and 100 amps per square foot.

TABLE 3

| Iron Thickness / Temper (Microinches) | Bend Results |
| --- | --- |
| 75 / ½hard | No Cracking |
| 120 / ½hard | No Cracking |
| 170 / ½hard | No Cracking |
| 200 / ½hard | No Cracking |
| 30 / Extra Spring | No Cracking |
| 75 / Extra Spring | No Cracking |
| 120 / Extra Spring | No Cracking |
| 170 / Extra Spring | Hair Line Cracking |
| 200 / Extra Spring | Cracking |

Table 3 shows that the iron thickness is critical in order to avoid temper sensitive cracking due to copper alloy temper.

It is apparent that there has been provided in accordance with the present invention a barrier layer that is interposed between a copper base substrate and a tin base coating layer that fully satisfies the objects, means and advantages set forth hereinabove. While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A composite material for use as an electrical conductor at an anticipated service temperature, comprising:
   a copper base substrate;
   a tin base coating; and
   a barrier layer disposed between said substrate and said coating and in direct contact with said coating, said barrier layer being a plurality of constituent layers, a first one of said constituent layers being copper base and a second one of said constituent layers being transition metal base wherein the thickness of said first constituent layer ("y") is the greater of 5 microinches and the value:

$$y=(-1.52+0.0871x+0.00859t)\pm 50\%$$

where:
   t=anticipated time at service temperature (hours) and is up to 3,000 hours
   x=anticipated service temperature (Celsius) and is from 120° C.–175° C. and
   y=first constituent layer thickness in microinches.

2. The composite material of claim 1 wherein said first constituent layer is in direct contact with said tin base coating.

3. The composite material of claim 2 wherein y=(−1.52+0.0871x+0.00859 t)±30%.

4. The composite material of claim 2 wherein the thickness of said tin base coating ("z"), as deposited, is the greater of 15 microinches and the value:

$$z=(2.2703y-8.9867)\pm 50\%$$

where:
   y=first constituent layer thickness in microinches and
   z=tin thickness, as-deposited, in microinches.

5. The composite material of claim 4 wherein z=(2.2703y−8.9867)±30%.

6. The composite material of claim 3 wherein the thickness of said tin base coating ("z"), as deposited, is the value:

$$z=(2.2703y-8.9867)\pm 30\%$$

where:
   y=first constituent layer thickness in microinches and
   z=tin thickness, as-deposited, in microinches.

7. The composite material of claim 4 wherein said transition metal is nickel.

8. The composite material of claim 4 wherein said transition metal is iron.

9. The composite material of claim 2 further including a third constituent layer in direct contact with said second constituent layer and disposed between said second constituent layer and said substrate.

10. The composite material of claim 9 further including a fourth constituent layer in direct contact with both said third constituent layer and with said substrate.

11. The composite material of claim 10 wherein said first and third constituent layers are copper and said second and fourth constituent layers are a transition metal.

12. The composite material of claim 11 wherein said transition metal is nickel.

13. The composite material of claim 11 wherein said transition metal is iron.

14. The composite material of claim 1 formed into an electrical connector socket.

15. The composite material of claim 4 formed into an electrical connector socket.

16. The composite material of claim 1 formed into a leadframe.

17. The composite material of claim 4 formed into a leadframe.

18. The composite material of claim 1 formed into a circuit trace for a printed circuit board.

19. The composite material of claim 4 formed into a circuit trace for a printed circuit board.

20. A composite material, comprising:
    a copper base substrate;
    a tin base coating; and
    a barrier layer disposed between said substrate and said coating layer and in direct contact with both said substrate and said coating, said barrier layer being formed from one or more constituent layers, at least one of said constituent layers being iron base and having a thickness of from that effective to retain a substantially continuous barrier layer following immersion in molten tin to about 150 microinches.

21. The composite material of claim 20 wherein said iron base constituent layer has a thickness of from 15 microinches to about 50 microinches.

22. The composite material of claim 20 wherein said tin base coating has a microstructure commensurate with hot air leveled tin.

23. The composite material of claim 20 wherein said tin base coating has a microstructure commensurate with mechanically wiped tin.

* * * * *